United States Patent [19]
Yamamoto et al.

[11] Patent Number: 5,994,205
[45] Date of Patent: Nov. 30, 1999

[54] METHOD OF SEPARATING SEMICONDUCTOR DEVICES

[75] Inventors: Masahiro Yamamoto; Hidetoshi Fujimoto, both of Kawasaki, Japan

[73] Assignee: Kabushiki Kaisha Toshiba, Kawasaki, Japan

[21] Appl. No.: 09/017,238

[22] Filed: Feb. 2, 1998

[30] Foreign Application Priority Data

Feb. 3, 1997 [JP] Japan ..................................... 9-020820
Aug. 22, 1997 [JP] Japan ..................................... 9-226677

[51] Int. Cl.$^6$ ................................................. H01L 21/301
[52] U.S. Cl. ........................... 438/464; 438/462; 438/110
[58] Field of Search .................................... 438/110, 113, 438/114, 458, 459, 462, 464, 460, FOR 385, FOR 386, FOR 387; 148/DIG. 28

[56] References Cited

U.S. PATENT DOCUMENTS

| | | | |
|---|---|---|---|
| 4,722,130 | 2/1988 | Kimura et al. ............................. | 29/413 |
| 5,071,792 | 12/1991 | VanVonno et al. ....................... | 438/17 |
| 5,494,549 | 2/1996 | Oki et al. ................................ | 156/268 |
| 5,824,177 | 10/1998 | Yoshihara et al. ....................... | 156/250 |
| 5,888,883 | 3/1999 | Sasaki et al. ............................ | 438/460 |

FOREIGN PATENT DOCUMENTS

6-283758  10/1994  Japan .

Primary Examiner—Carl Whitehead, Jr.
Assistant Examiner—Jamie L. Davis
Attorney, Agent, or Firm—Oblon, Spivak, McClelland, Maier & Neustadt, P.C.

[57] ABSTRACT

A top surface of a wafer, at which semiconductor devices are formed, is bonded to an auxiliary plate by means of a first wax. In a state where the auxiliary plate is bonded to a polishing jig by means of a second wax, a bottom surface of the wafer, at which a sapphire substrate is provided, is polished. The second wax is melted and the auxiliary plate is removed from the polishing jig. In this state, scribe lines are formed in the bottom surface of the wafer according to a device separation pattern. Then, the bottom surface of the wafer is attached to an adhesive sheet, following which the first wax is melted and the wafer is removed from the auxiliary plate 105. Subsequently, the adhesive sheet is extended and the wafer is divided into the devices along the scribe lines.

20 Claims, 6 Drawing Sheets

FIG. 8 not ⟨11̄20⟩
not ⟨1̄100⟩

METHOD OF SEPARATING SEMICONDUCTOR DEVICES

BACKGROUND OF THE INVENTION

The present invention relates generally to a method of separating, in units of a chip, semiconductor devices formed on a wafer, and more particularly to a method of separating semiconductor devices, which is suitable for cases where single-crystal substrates with low cleavage such as sapphire substrates are used.

The present invention also relates to a method of separating semiconductor devices, including a step of polishing semiconductor devices wherein Group III nitride semiconductor layers are stacked on a substrate of sapphire, etc.

Recently, attention has been paid to gallium nitride-based compound semiconductors, such as GaN, as materials of short-wavelength light emitting diodes (LED) or semiconductor laser devices (LD) for use in a range between blue light and ultraviolet. The LED using such a material is indispensable in constructing a display as a light emitting device for emitting blue light, i.e., one of the three primary colors of light. It is expected that the blue light semiconductor laser device will be applied to a light source for high-density information processing because of its short oscillation wavelength.

Conventionally gallium nitride-based compound semiconductor layers are grown on a sapphire substrate. In this case, there is a problem in that device separation (i.e., division of devices in units of a chip) is difficult due to low cleavage of sapphire. Some solutions for this problem have been proposed. For example, Jpn. Pat. Appln. KOKAI Publication No. 5-315646 discloses that grooves are formed in a wafer, in which crystals have been grown on a substrate, by means of dicing from the crystal side, and then the substrate is polished, following which scribe lines are formed along the grooves to separate devices.

Applied methods of this technique are described in Jpn. Pat. Appln. KOKAI Publication No. 5-343742, Jpn. Pat. Appln. KOKAI Publication No. 7-273069, Jpn. Pat. Appln. KOKAI Publication No. 8-222807, etc. In these methods, grooves are made in both top and bottom surfaces of wafers and thus devices are separated. Another method is described in Jpn. Pat. Appln. KOKAI Publication No. 6-283758. In this method, after a sapphire substrate is polished, a warped wafer including the sapphire substrate is held and flattened and in this state scribe lines are formed in the wafer and the devices are separated by making use of a restoring force of the wafer.

In the above methods, however, a stress of the polished wafer is inevitably released when it is removed from a polishing jig. At the time of removing the wafer, it may be accidentally divided in an undesirable direction.

When a hard material such as sapphire or SiC is used in forming a substrate, a pressure force, greater than necessary, acts on the substrate. As a result, a strain greater than necessary occurs in the device and the performance of the device deteriorates. According to experiments by the inventors, in particular, when the bottom of the substrate is not flattened, this strain increases and becomes locally non-uniform. Consequently, the performance of the device considerably deteriorates.

As has been described above, in the prior art, when the wafer includes a sapphire substrate as an underlying layer for a semiconductor device, it is necessary to sufficiently polish the sapphire substrate before forming scribe lines to separate devices, because sapphire has low cleavage. In this case, when the polished wafer is removed from the polishing jig, stress of the wafer will be released and the wafer may be divided in an undesirable direction.

Moreover, the crystalline substrate of, e.g., sapphire or SiC, which is used as the underlying layer for the semiconductor device, is very hard. It is very difficult to polish and flatten the crystalline substrate, and as a result the performance of the device will decrease.

BRIEF SUMMARY OF THE INVENTION

The present invention has been made in consideration of the above circumstances, and an object thereof is to provide a method of separating semiconductor devices wherein scribe lines for separating the devices can be formed without releasing a stress of a polished wafer, and the wafer can be exactly divided into chips of a predetermined size.

Another object of the invention is to provide a method of separating semiconductor devices, including a step of flatly polishing a substrate of sapphire, SiC, etc., thus enhancing a device performance.

According to a first aspect of the invention there is provided a method of separating a plurality of semiconductor devices formed in a top surface of a wafer having the top surface and a bottom surface, the method comprising the steps of:

fixing the wafer on a polishing jig with an auxiliary plate interposed, such that the top surface faces the auxiliary plate and the bottom surface is exposed;

polishing the bottom surface of the wafer in a state where the wafer is fixed on the polishing jig, thus thinning the wafer;

scribing a separation pattern for separating the devices in the bottom surface of the wafer in a state where the wafer, after polished, is fixed on the auxiliary plate;

attaching an adhesive sheet to the bottom surface of the wafer, in which the separation pattern has been scribed;

removing the wafer as well as the adhesive sheet from the auxiliary plate; and dividing the wafer, removed from the auxiliary plate, into the devices according to the separation pattern in a state where the wafer is attached to the adhesive sheet.

According to a second aspect of the invention, in the method of the first aspect, the bottom surface of the wafer is defined by a sapphire substrate and each of the semiconductor devices includes a stacked structure of Group III nitride semiconductor layers.

According to a third aspect of the invention, in the method of the first or second aspect, the wafer and the auxiliary plate are bonded by a first adhesive, and the polishing jig and the auxiliary plate are bonded by a second adhesive.

According to a fourth aspect of the invention, in the method of the third aspect, there is provided a step of removing the wafer as well as the auxiliary plate from the polishing jig, between the step of polishing the wafer and the step of scribing the separation pattern.

According to a fifth aspect of the invention, in the method of the fourth aspect, the first and second adhesives consist essentially of first and second waxes respectively, the first wax has a higher melting point than the second wax, and the first and second waxes are heated in the step of removing the wafer as well as the auxiliary plate from the polishing jig.

According to a six aspect of the invention, in the method of the fourth aspect, the second adhesive consists essentially of a wax, and the second wax is heated by heat conduction from the polishing jig in the step of removing the wafer as well as the auxiliary plate from the polishing jig.

According to a seventh aspect of the invention, in the method of the fourth aspect, the second adhesive consists essentially of a wax, and the second wax is dissolved by a chemical in the step of removing the wafer as well as the auxiliary plate from the polishing jig.

According to an eighth aspect of the invention, in the method of the third aspect, the step of attaching the adhesive sheet to the bottom surface of the wafer is performed in a state where the wafer is fixed on the polishing jig with the auxiliary plate interposed.

According to a ninth aspect of the invention, in the method of the eighth aspect, the first and second adhesives consist essentially of first and second waxes respectively, the first wax has a lower melting point than the second wax, and the first and second waxes are heated in the step of removing the wafer from the auxiliary plate.

According to a tenth aspect of the invention, in the method of the first or second aspect, the semiconductor devices are laser devices, and the method comprises a step of scribing top-surface scribe lines for separating the laser devices on the top surface of the wafer, such that the top-surface scribe lines are formed to extend along oscillator end faces the laser devices and to skip light-emitting portions of the laser device. However, where the semiconductor devices are LEDs (Light-Emitting Diodes), it is not necessary to form skips in the top-surface scribe lines.

According to an eleventh aspect of the invention, in the method of the tenth aspect, the step of scribing the top-surface scribe lines is performed prior to the step of fixing the wafer on the polishing jig with the auxiliary plate interposed.

According to a twelfth aspect of the invention, in the method of the tenth aspect the step of scribing the top-surface scribe lines is performed after the step of removing the wafer from the auxiliary plate.

According to a 13th aspect of the invention, in the method of the first or second aspect, a polishing agent including a solution of pH7 or more is used in the step of polishing the bottom surface of the wafer.

According to a 14th aspect of the invention, in the method of the first or second aspect, the semiconductor devices are laser devices, and the method comprises a step of polishing oscillator end faces of each of the laser devices by using a polishing agent containing a solution of pH7 or more.

According to a 15th aspect of the invention, in the method of the 13th or 14th aspect, the solution of pH7 or more comprises at least one selected from the group consisting of isopropylmethylphenol, triethanolamine, propylene glycol, polyethylene glycol, dibuthylhydroxy-toluene, oxybenzone, alkyl ether, sulfuric acid ester solidum, alpha-olefin sodium sulfonate, aliphatic acid alkanolamide, alkylamine oxide, and a surface-active agent.

In the present invention, scribe lines are formed in a state where the wafer, even after polished, is fixed on the auxiliary plate. In other words, the wafer is not removed from the auxiliary plate until the scribe lines have been scribed in the polished wafer. Thus, such a problem that the wafer is unintentionally divided in a certain direction by the release of stress can be prevented, and the wafer can be exactly divided along scribe lines. This advantage is very effective in the case of using a single-crystal substrate with low cleavage such as a sapphire substrate.

In addition, waxes are used to bond the wafer and auxiliary plate and to bond the auxiliary plate and polishing jig. By controlling the heating temperature and heating method, the separation between the wafer and auxiliary plate and between the auxiliary plate and polishing jig can be performed in a desired order.

According to the present invention, the bottom surface of the substrate of sapphire, SiC, etc. is polished by using a solution of pH7 or more. In this case, since the substrate reacts with the solution, the bottom surface of the substrate can be flattened on the atomic order. In this state, only natural stress due to a difference in lattice constant between the substrate and the Group III nitride semiconductor layers placed on the substrate is present, and the stress is uniform over the entire substrate. Therefore, the performance of the device does not deteriorate.

Furthermore, in general, cleavage does not easily occur in Group III nitride semiconductors. However, by polishing an end face with use of a polishing liquid with pH7 or more, a flat face can be obtained on the atomic order by the polishing effect including a chemical reaction. Therefore, for example, a semiconductor laser device with a low oscillation threshold can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 1A:
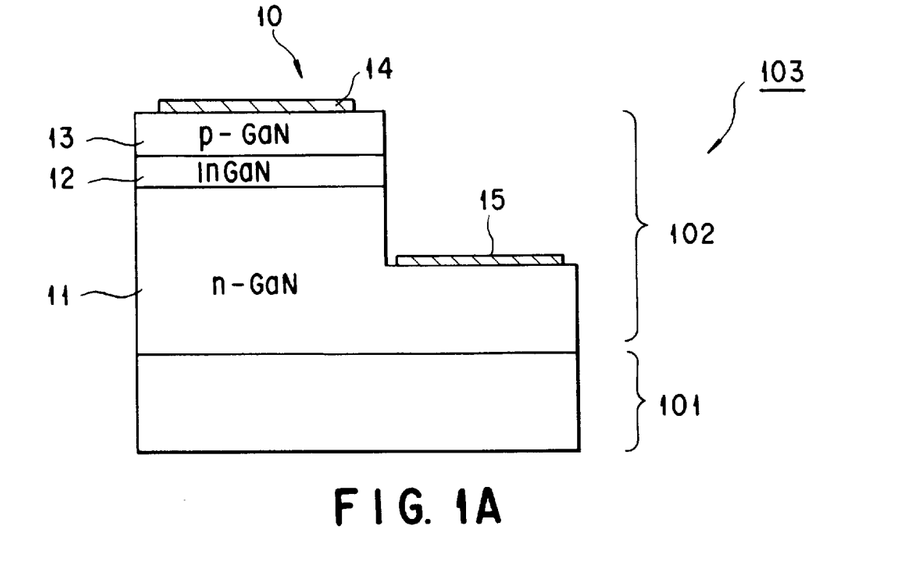
FIG. 1A is an enlarged cross-sectional view of one of light-emitting devices separated by a semiconductor device separating method according to a first embodiment of the present invention.
Figure 1B:
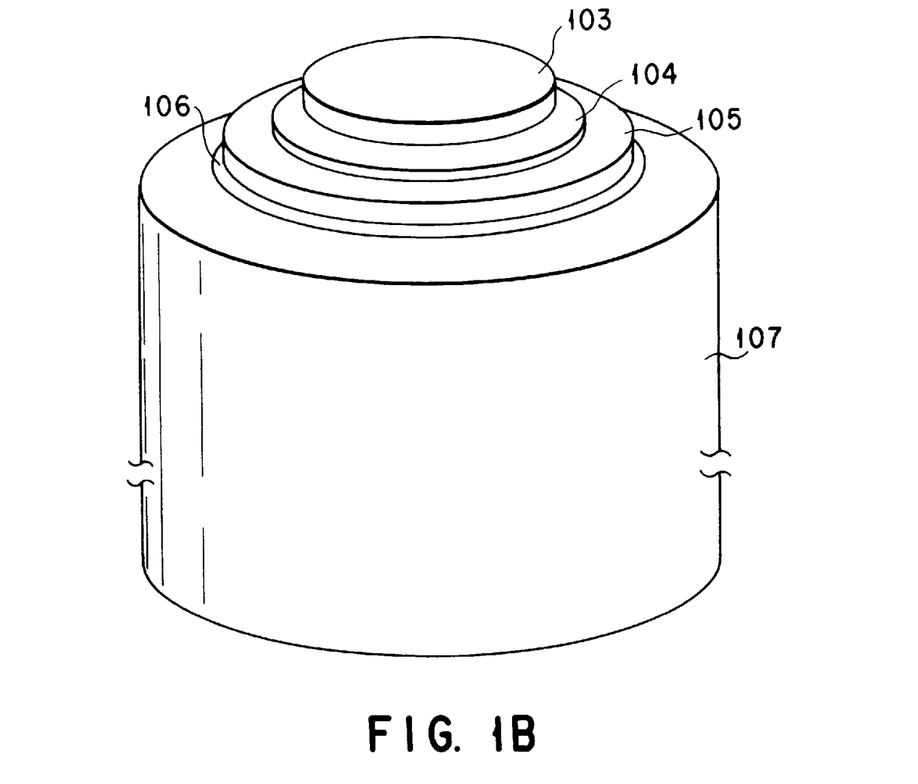
FIG. 1B is a perspective view showing a state in which a wafer is fixed on a polishing jig in the method according to the first embodiment.

FIG. 1A is an enlarge cross-sectional view of one of light-emitting devices, i.e., light-emitting diodes or laser diodes 10 separated by a semiconductor device separating method according to a first embodiment of the invention, and FIG. 1B is a perspective view showing a state in which a wafer 103 is fixed on a polishing jig in the method according to the first embodiment.

FIGS. 2A to 2D illustrate the steps of the method in succession.

In this method, at first, a wafer 103 was prepared. The wafer 103 included a sapphire substrate 101 having a thickness of 330 μm and a diameter of 2 inches, and a stacked structure 102 of GaN-based semiconductors formed on the substrate 101 and constituting a main part of the light-emitting device 10. The GaN-based semiconductors are represented by the following general formula:

$In_xAl_yGa_zN_uAs_vP_w$ ($x+y+z=1$, $0 \leq x, y, z \leq 1$; $u+v+w=1$, $0<u\leq 1$, $0 \leq v, w<1$)

The stacked structure 102 was formed by growing, by means of conventional metal organic chemical vapor deposition (MOCVD), an n-type GaN layer 11, an InGaN light-emitting layer 12 and a p-type GaN layer 13, as shown in FIG. 1A, so that the total thickness of these layers became about 6 μm. Part of the stacked structure 102 was etched, and electrode patterns, i.e., a p-side electrode 14 and an n-side electrode 15, were formed on p-type and n-type layers respectively.

As is shown in FIG. 1B, the wafer 103 was bonded on an auxiliary plate 105 or a reference plate having high flatness by means of first wax 104. The auxiliary plate 105 was bonded on a jig (polishing jig), e.g., a piston 107, connected to a polishing machine by using second wax 106. In this case, the top surface of the wafer 103, at which the stacked structure 102 is provided, was made to face the auxiliary plate 105 and the bottom surface of the wafer 103 was exposed. Both first and second waxes 104 and 106 consist mainly of beeswax and have melting points of about 120° C. and about 60° C. respectively. The main constituent of first and second waxes 104 and 106 is not limited to beeswax, and may be shellac, etc.

In the state shown in FIG. 1B, the bottom surface of the wafer 103 was polished so that the sapphire substrate 101 became 80 μm thick. In the polishing process, diamond powder was used for rough polishing, diamond slurry was used for formation of a mirror surface, and colloidal silica was used for finishing. In this case, as will be described in connection with a third embodiment of the invention, the bottom surface of the wafer 103 was mirror-finished on the atomic order by using diamond slurry and a solution of pH7 or above for the formation of mirror surface of finishing.

Figure 2A:
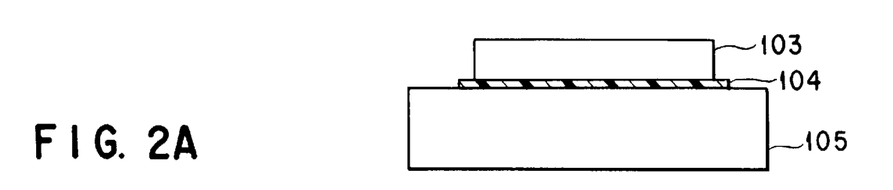
FIG. 2A to FIG. 2D illustrate in succession the steps of separating semiconductor devices according to the first embodiment of the invention.

Subsequently, the piston 107 was heated at about 80° C., and the second wax 106 and first wax 104 were heated by heat conduction. The melting point of second wax 106 was about 60° C. and much lower than that of first wax 104, which was 120° C. By this heating operation, the second wax 106 alone was melted. Then, as shown in FIG. 2A, the wafer 103, while being fixed on the auxiliary plate 105, was removed from the piston 107.

Figure 2B:
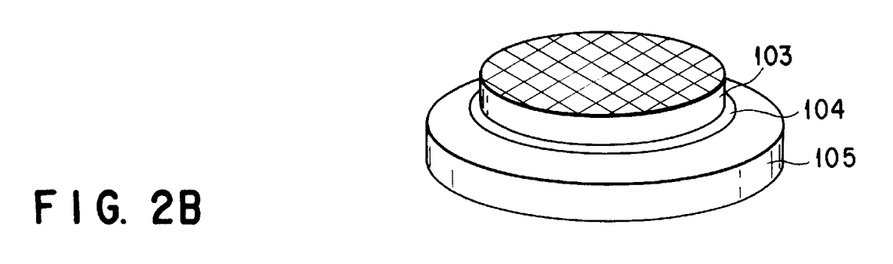

Following the above, as shown in FIG. 2B, a separation pattern for dividing the wafer 103 in units of a light-emitting device 10 was scribed in the bottom surface of the wafer 103 fixed on auxiliary plate 105, i.e., the bottom surface of the sapphire substrate 101. In this case, the depth of scribe lines was set at a large value so that the scribe lines would not reach the stacked structure 102 of GaN-based material. Deep scribe lines were formed since the wafer 103 was fixed on the auxiliary plate 105. Where the thickness of the remaining sapphire substrate 101 is about 80 μm, as in this embodiment, it is desirable that the depth of scribe lines be 20 μm or more and 70 μm or less.

Figure 2C:
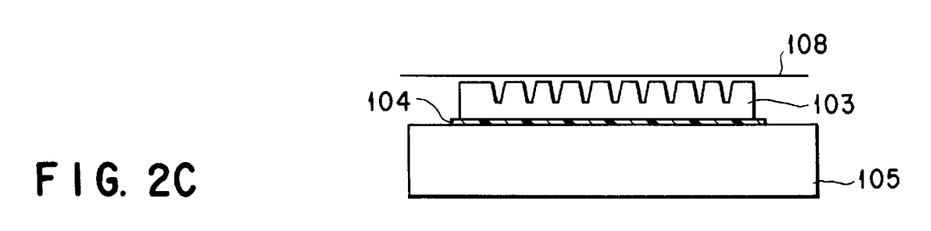
Figure 2D:
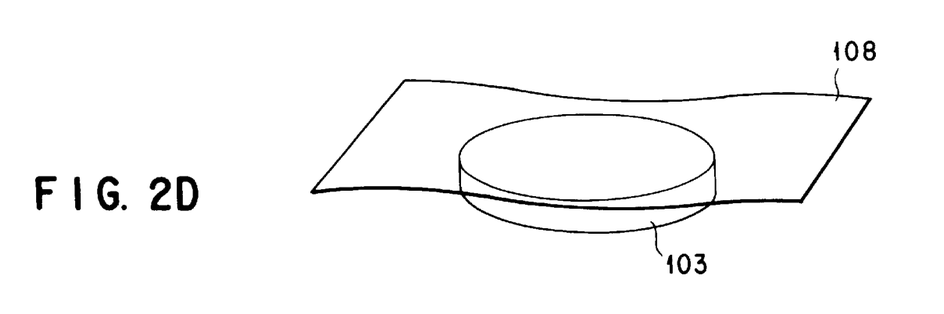

Then, as shown in FIG. 2C, an adhesive sheet 108 was attached to the bottom surface of wafer 103, i.e., the scribed side of the sapphire substrate 101. The auxiliary plate 105 was heated at about 120° C. to melt the first wax 104 and, as shown in FIG. 2D, the wafer 103 with adhesive sheet 108 was removed from the auxiliary plate 105. At this time, the heating temperature must be higher than the temperature at which the first wax 104 melts and lower than the temperature at which the sheet 108 melts. Specifically, in the present embodiment, it is necessary that this heating temperature be 120° C. or more and 200° C. or less. In addition, in order to prevent diffusion of impurities in the crystal or fusion with the crystal of sheet material, it is desirable that the heating temperature be low, i.e., 150° C. or less.

When the wafer 103 attached to the adhesive sheet 108 was removed from the auxiliary plate 105, the wafer 103 was in a state that it could easily be divided. The devices were easily separated by extending the sheet 108. In this case, the devices may not always be separated at all locations of separation. It is thus desirable that the devices should completely be separated by applying shearing stress in advance.

According to the present embodiment, the wafer 103 is polished in a state where the wafer 103 is bonded to the auxiliary plate 105 and the auxiliary plate 105 is bonded to the piston 107. After the polishing, the auxiliary plate 105 is removed from the piston 107, and the scribe lines are scribed on the wafer 103 in a state where the wafer 103 is bonded to the auxiliary plate 105. Thereby, such a problem that the wafer 103 is unintentionally divided in a certain direction due to release of stress can be prevented, and the yield of products can be increased. According to experiments, the yield in the conventional method was 50% to 60% whereas the yield in the method of the present embodiment was 90% or more.

In the present embodiment, since the wafer wherein the semiconductor devices are formed on the sapphire substrate with low cleavage can be efficiently separated, a mirror-surface end face of a resonator, which is required in a semiconductor laser device, etc., can be formed. Moreover, the flatness of the end face of the resonator can be improved by polishing the end face with use of diamond slurry and a solution of pH7 or more, as will be described in the third embodiment of the invention.

In this embodiment, different materials were used as first and second waxes 104 and 106. However, these waxes 104 and 106 may be the same material. In this case, however, proper care is required in the step of melting second wax 106, as shown in FIGS. 1B and 2A. For example, one or more of the following modifications need to be made: to increase the thickness of second wax 106, to increase the thickness of auxiliary plate 105, and to decrease the heat conductivity of auxiliary plate 105.

For example, it is desirable that the thickness of the second wax 106 be set at 20 μm or more and the thickness of the auxiliary plate 105 be set at 5 mm or more. If the second wax 106 and auxiliary plate 105, one of which has a less thickness, are used, the first wax 104 would also melt while the second wax 106 melts. In a case where such thick wax and auxiliary plate are used, one of the two waxes can be dissolved by using a chemical such as acetone. Specifically, the structure including the wafer 103 and auxiliary plate 105 is immersed in acetone so that the liquid level may come to a position between the second wax 106 and first wax 104, and thus the second wax 106 alone can be dissolved.

Alternatively, the piston may be placed on a heating plate and the structure may be heated in one direction. In this case, the structure is heated for such a time period that the second wax 106 melts while the first wax 104 does not melt. It is desirable, for example, that where the first and second waxes 104 and 106 are formed of wax melting at 80° C., the heating is performed at 90° C. for about one minute, and where the waxes 104 and 106 are formed of wax melting at 150° C., the heating is performed at 160° C. for about five to ten minutes.

When the first and second waxes 104 and 106 are formed of wax melting at 80° C., it is possible to immerse the structure in water in a temperature range of 80° C. to 90° C. from the piston (107) side up to the auxiliary plate 105. When the heated water is used, it is preferable to wash the surface of wafer 103 with alcohol, etc. after the treatment. Besides, a heating member with a sharp edge may be used to locally heat the second wax 106 alone, thereby separating the piston 107 and auxiliary plate 105.

Moreover, the auxiliary plate 105 can be fixed to the piston 107 by using a vacuum chuck, in place of wax. This method can facilitate the treatment work since attention needs to be paid to the melting point of the first wax 104 alone.

(Second Embodiment)

Figure 3A:
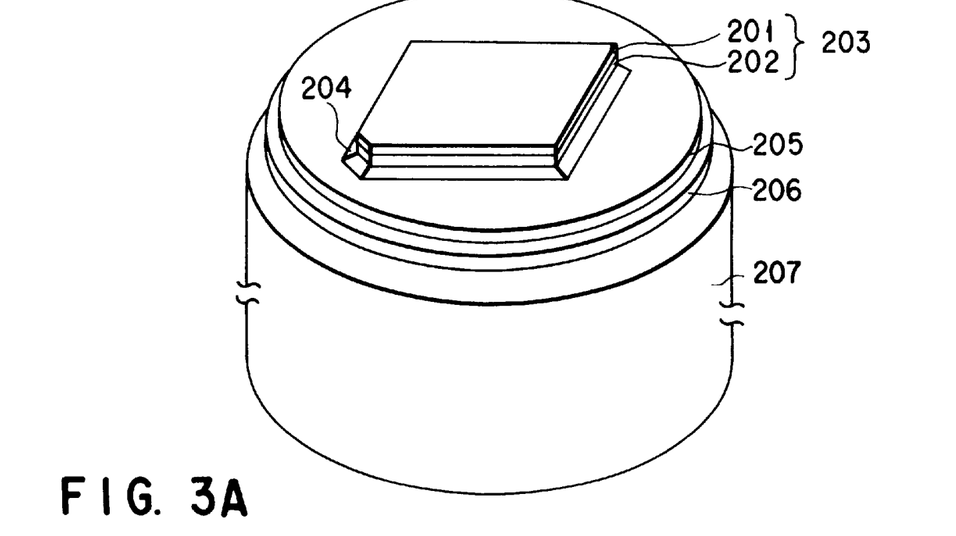
FIG. 3A to FIG. 3C illustrate in succession the steps of separating semiconductor devices according to a second embodiment of the invention.
Figure 3B:
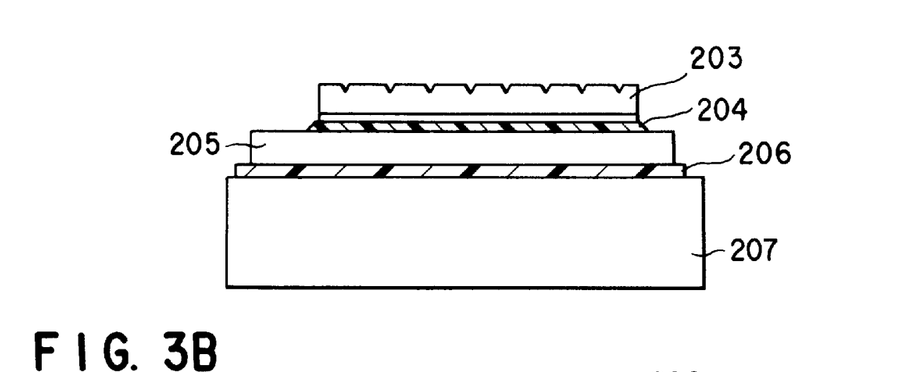
Figure 3C:
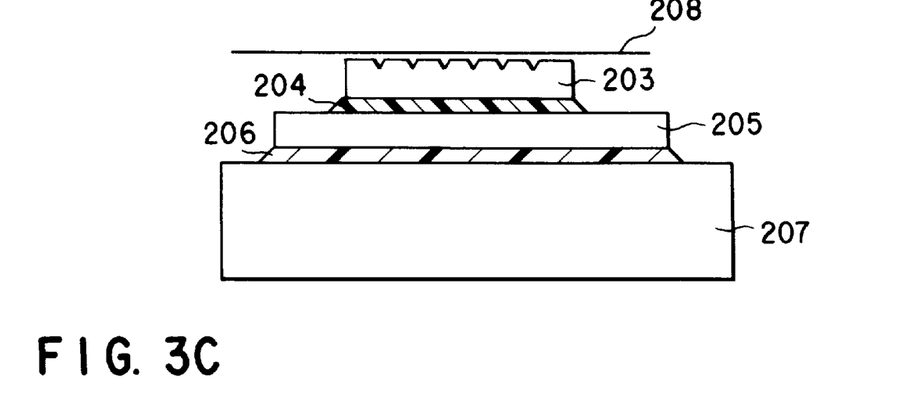

FIGS. 3A to 3C illustrate in succession the steps of separating semiconductor devices according to a second embodiment of the invention.

In this method, at first, a wafer 203 was prepared. The wafer 203 included a square sapphire substrate 201 having a thickness of 300 μm and each side of 1 inch, and a stacked structure 202 of GaN-based semiconductors formed on the substrate 201 and constituting a main part of a light-emitting device. The stacked structure 202 was formed by growing, by means of conventional metal chemical organic vapor deposition (MOCVD), an n-type GaN layer 11, an InGaN light-emitting layer 12 and a p-type GaN layer 13, as shown in FIG. 1A, so that the total thickness of these layers would become about 10 μm. Part of the stacked structure 202 was etched, and electrode patterns, i.e., a p-side electrode 14 and an n-side electrode 15, were formed on p-type and n-type layers respectively.

As is shown in FIG. 3A, the wafer 203 was bonded on an auxiliary plate 205 or a reference plate with high flatness by means of first wax 204. The auxiliary plate 205 was bonded on a jig (polishing jig), e.g., a piston 207, connected to a polishing machine by using second wax 206. In this case, the top surface of the wafer 203, at which the stacked structure 202 was provided, was made to face the auxiliary plate 205 and the bottom surface of the wafer 203 was exposed. Both first and second waxes 204 and 206 had melting points of about 60° C. and about 150° C. respectively.

In the state shown in FIG. 3A, the bottom surface of the wafer 203 was polished so that the sapphire substrate 201 would become 40 μm thick. Then, as shown in FIG. 3B, a separation pattern for dividing the wafer 203 in units of a light-emitting device was scribed in the bottom surface of the wafer 203 fixed on auxiliary plate 205, i.e., the bottom surface of sapphire substrate 201. In this embodiment, since the thickness of the remaining sapphire substrate 201 is about 40 μm, the devices can be separated even if the depth of scribe lines is shallow, e.g., about 10 μm.

Then, as shown in FIG. 3C, an adhesive sheet 208 was attached to the scribed side of the sapphire substrate 201. The first and second waxes 204 and 206 were heated at about 70° C. to 100° C. and the first wax 204 was melted. Thus, the wafer 203 was removed from the auxiliary plate 205.

When the wafer 203 attached to the adhesive sheet 208 was removed from the auxiliary plate 205, the wafer 203 was in a state where it could easily be divided. The devices were thus easily separated by extending the sheet 208. In this method, although the effective portion of the wafer 203 was slightly decreased since the substrate 201 was polished to 40 μm, the number of effective chips was increased in the separating process. According to experiments, the yield in the method of the present embodiment was increased up to 90% or more.

As described above, the first and second embodiments can be applied to various kinds of semiconductor devices, such as light-emitting diodes or semiconductor laser devices.

In the first and second embodiments, a sapphire substrate having a C-plane ((0001) plane) as a major plane is used. Scribe lines are cut along an A-axis (<11-20>) and an M-axis (<10-10>) perpendicular to the A-axis. The present invention is not limited to this mode. For example, it is possible that a sapphire substrate having an A-plane ((11-20) plane) as a major plane is used, and scribe lines are cut along an R-axis (<10-12>) and an axis perpendicular to the R-axis. Alternatively, since the sapphire substrate and the GaN-based material placed on the substrate have planes coinciding at M-plane, it is possible to form scribe lines in a C-axis direction, in which M-plane appears, and a direction perpendicular to the C-axis direction. In addition, where a substrate with an R-plane is used, scribe lines can be formed along X-plane and A-plane. In a semiconductor laser device with such scribe lines, both M-plane and A-plane of sapphire can be used as resonator end faces. Moreover, a substrate with N-plane (<10-13>) can be used. In this case, it is desirable to form scribe lines along R-axis or M-axis. Even if any plane is used, a resonator end face with low reflection loss can be formed.

The first and second embodiments are directed to only cases where GaN-based material is formed on the sapphire substrate. These embodiments, however, can be applied to, e.g., SOS (Silicon-on-Sapphire) devices wherein an Si film, etc. are formed on a sapphire substrate. Besides, these embodiments are not limited to the use of a sapphire substrate, but are applicable to single-crystal substrates of spinel, quartz, etc. with low cleavage, or to substrates with low cleavage other than single-crystal substrates.

(Third Embodiment)

A polishing method according to a third embodiment of the invention will now be described with reference to FIGS. 4A, 4B, 5 and 6. The polishing method of this embodiment can be applied to the first and second embodiments in the step of polishing the bottom surface of the wafer.

Figure 4A:
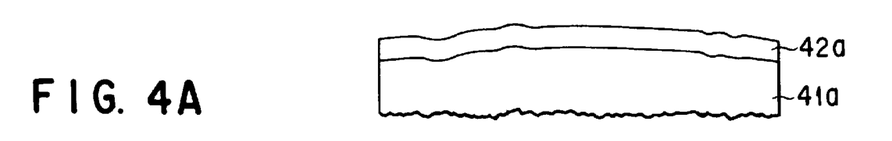
FIGS. 4A and 4B show wafers, respectively, obtained by a conventional bottom-side polishing method and a bottom-side polishing method according to a third embodiment of the invention.

In FIG. 4A, a GaN-based semiconductor layer 42a is provided on a sapphire substrate 41a, the bottom surface of which has been polished by using diamond slurry. The sapphire substrate 41a is not flattened, and strain is non-uniformly present in the GaN-based semiconductor layer 42a.

Figure 4B:
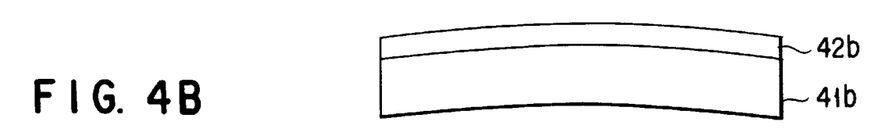

In FIG. 4B, a GaN-based semiconductor layer 42b is provided on a sapphire substrate 41b, the bottom surface of which has been mirror-polished by using diamond slurry and a solution of pH7 or more. The sapphire substrate 41b is flattened, strain is uniformly present in the GaN-based semiconductor layer 42b.

Figure 5:
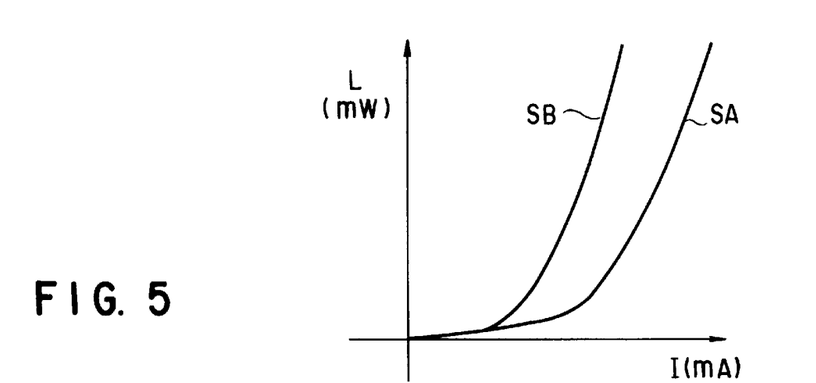
FIG. 5 shows I–L characteristics in samples SA and SB of laser diodes associated with the wafers shown in FIGS. 4A and 4B.

FIG. 5 is a graph showing current (I)/optical output (L) characteristics of samples SA and SB, which have the same structure as that of the laser diode shown in FIG. 1A, and have undergone treatments corresponding to those of FIGS. 4A and 4B. As is shown in FIG. 5, it turned out that the mirror-polished sample corresponding to FIG. 4B had the lower threshold value.

Figure 6:
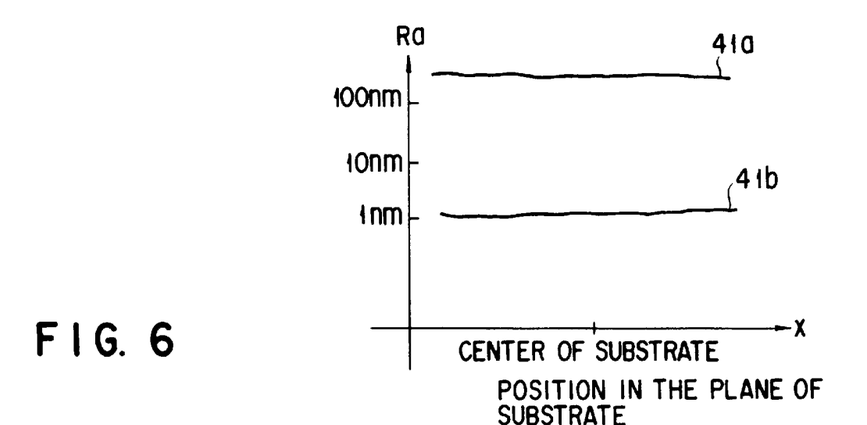
FIG. 6 shows average roughnesses of bottom surfaces of substrates of the wafers shown in FIGS. 4A and 4B.

FIG. 6 shows examination results of roughness of bottom surfaces of substrates 41a and 41b shown in FIGS. 4A and 4B. The average roughness Ra of the substrate 41a polished by using only diamond slurry was several hundreds nm. The average roughness Ra of the substrate 41b polished by using diamond slurry and a solution of pH7 or more (e.g., a solution of mixture of isopropylmethylphenol, triethanolamine and propylene glycol) was about 1 $\mu$m. Compared to the case of using only diamond slurry, it turned out that the average roughness Ra was reduced to $\frac{1}{100}$ by the use of the diamond slurry and solution of pH7 or more, as in the present embodiment, and that the bottom surface was flattened on the atomic order.

The solution of pH7 or more is not limited to the above-mentioned one. It may be at least one selected from the group consisting of isopropylmethylphenol, triethanolamine, propylene glycol, polyethylene glycol, dibuthylhydroxytoluene, oxybenzone, alkyl ether, sulfuric acid ester solidum, alpha-olefin sodium sulfonate, aliphatic acid alkanolamide, alkylamine oxide, and a surface-active agent. The material of the substrate is not limited to sapphire and may be a material permitting growth of Group III nitride semiconductor, e.g., SiC.

(Fourth Embodiment)

A polishing method according to a fourth embodiment will now be described with reference to FIGS. 7A and 7B. In cases where the semiconductor devices in the first and second embodiments are laser devices, this polishing method can be applied to the polishing of resonator end faces of the laser devices. This method is normally carried out after the wafer is divided into semiconductor devices.

Figure 7A:
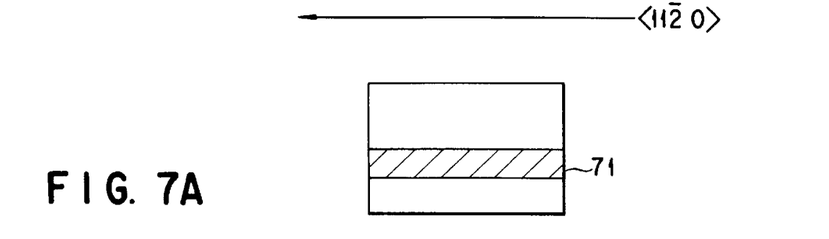
FIGS. 7A and 7B show semiconductor devices obtained, respectively, by a conventional end-face polishing method and an end-face polishing method according to a fourth embodiment of the invention.

FIG. 7A shows a conventional LD stripe (e.g., mesa stripe, electrode stripe) 71 in a GaN-based laser device. The end face of the stripe 71, i.e., the resonator end face, is vertical to <11-20> axis of a GaN or sapphire substrate.

Figure 7B:
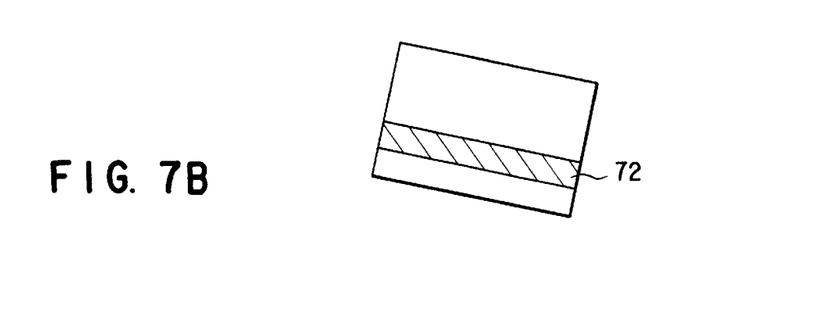

FIG. 7B shows an LD stripe 72 in a GaN-based laser device according to the present embodiment. The end face of the stripe 72, i.e., the resonator end face, is mirror-polished by using the diamond slurry and the solution of pH7 or more, which are used in the third embodiment.

In the present embodiment, the direction of the stripe can be set irrespective of the crystal orientation of GaN or sapphire. Thus, the end face can be formed in a direction perpendicular to the stripe direction, independently from the crystal orientation. There is no need to make the stripe agree with a predetermined crystal orientation. Thereby, the end face is prevented from being displaced from a direction perpendicular to the stripe direction due to a displacement of the stripe direction from a predetermined crystal orientation, and the yield of devices can be increased.

(Fifth Embodiment)

A semiconductor laser device 80 according to a fifth embodiment of the invention will now be described with reference to FIG. 8.

An undoped GaN buffer layer 82 and an n-type GaN contact layer 83 are formed on a sapphire substrate 81. An n-type AlGa clad layer 84, an active region 85 to 87 and a p-type AlGaN clad layer 88 are stacked on the resultant structure. The active region 85 to 87 has a structure wherein a quantum well active layer 86 of an InGaN-based material is interposed between an n-side GaN optical guide layer 85 and a p-side GaN optical guide layer 87. A low-resistance p-type GaN layer 89 and an n-type current block layer 90 are stacked on the p-type AlGaN clad layer 88. A stripe-shaped opening portion having a width of 3 $\mu$m is formed in the current block layer 90. A p-type GaN contact layer 91 is formed in the opening portion and on the current block layer 90.

Part of the above-described stacked structure is etched away from the p-type GaN contact layer 91 to the n-type GaN contact layer 83. An n-side electrode 92 is provided on the exposed n-type GaN contact layer 83. In addition, a p-side electrode 93 is provided on the p-type GaN contact layer 91.

A wafer having a plurality of laser devices 80 with the above structure was processed, for example, by the separating method according to the first embodiment and separated in units of a device or a chip. The end face (resonator end face) of each chip was polished by using diamond slurry and a solution of pH7 or more so as to be perpendicular to the stripe direction. The solution of pH7 or more was the same as that used in the third embodiment in polishing the bottom surface.

The threshold of the thus obtained laser device was 1 kA/cm$^2$ which was ½ or less of the threshold in the case of forming the chip end face by cleavage alone. Thus, a better result was obtained in the case of forming the resonator end face by polishing with use of the solution of pH7 or more, than in the case of forming the resonator end face with use of cleavage.

(Sixth Embodiment)

A method according to a sixth embodiment of the invention will now be described with reference to FIGS. 9A and 9B. This method aims at easily forming a resonator end face as a cleavage plane when the semiconductor device in the first and second embodiments is, for example, a laser device as shown in FIG. 8.

Figure 8:
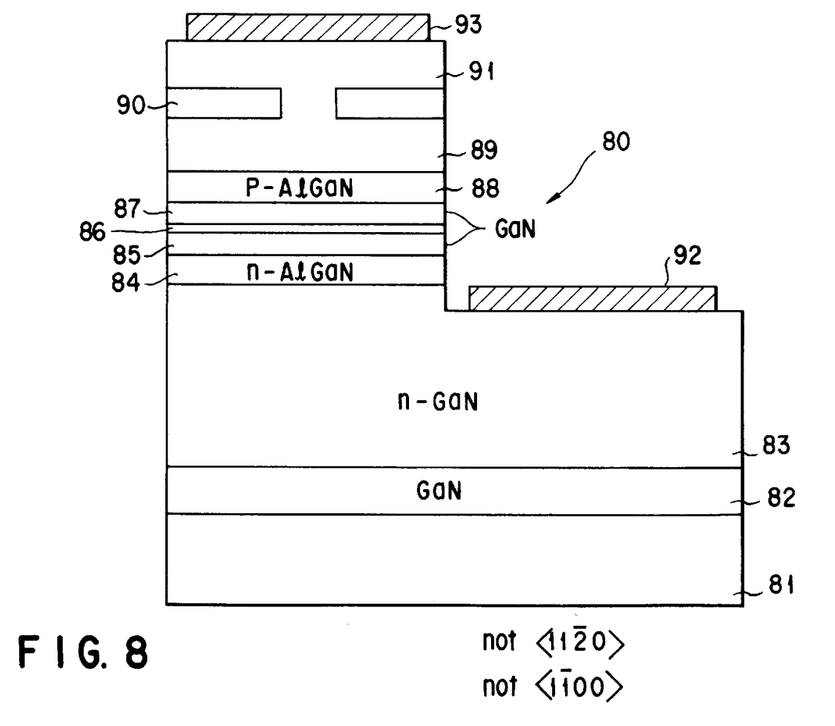
FIG. 8 is a cross-sectional view showing a semiconductor laser device according to a fifth embodiment of the invention.

Since formation of a cleavage plane is difficult in a hexagonal-system semiconductor represented by a GaN-based semiconductor, it is very difficult to form a reflection mirror, etc. in the laser device 80 shown in FIG. 8. To cope with this problem, according to the present embodiment, top-surface scribe lines for separating laser devices 80 are formed on the top surface of the wafer wherein the GaN-based semiconductor stacked structures are formed.

Figure 9A:
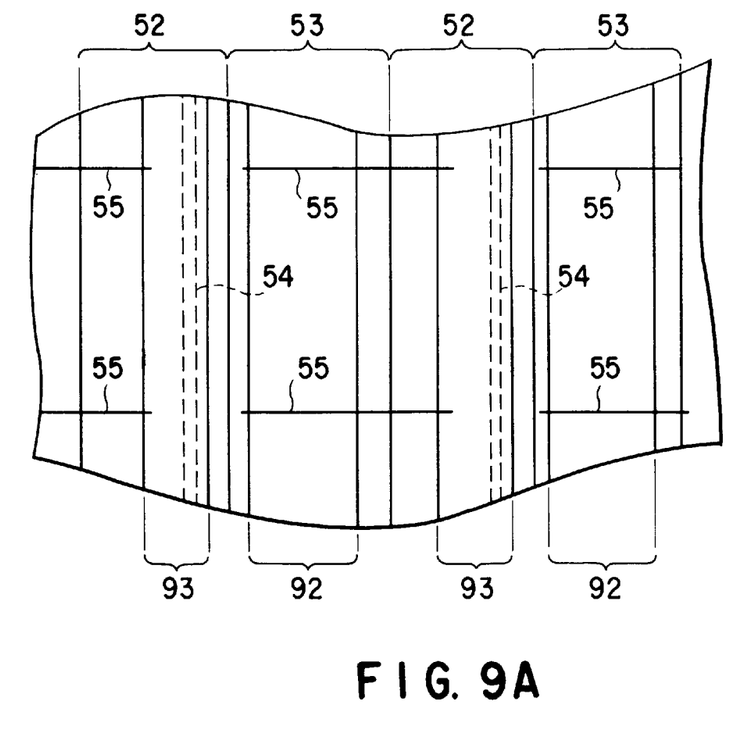
FIGS. 9A and 9B are a plan view and a cross-sectional views, respectively, showing a state of a wafer before separation of laser devices in a semiconductor device separating method according to a sixth embodiment of the invention.
Figure 9B:
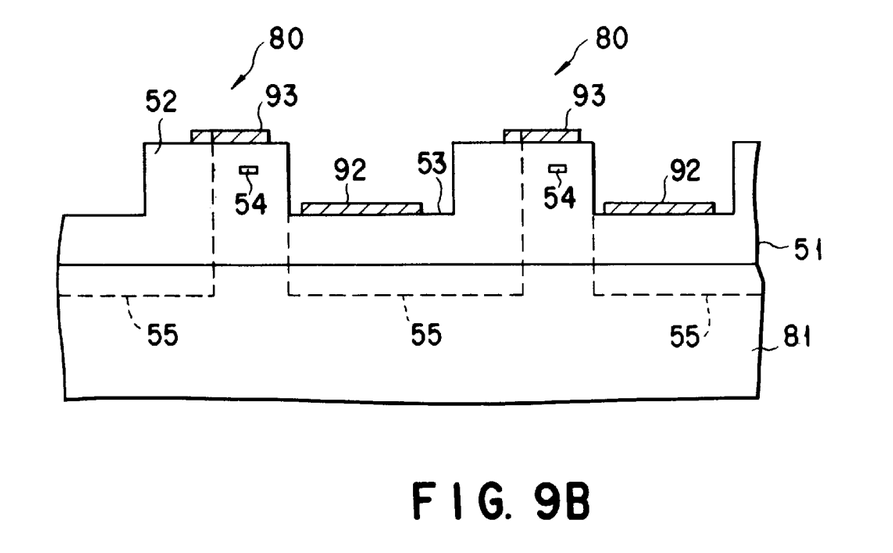

FIGS. 9A and 9B are a plan view and a cross-sectional view showing the wafer before separation of laser devices 80 in the semiconductor device separating method according to the sixth embodiment.

A GaN-based semiconductor stacked structure 51 is provided on a sapphire substrate 81. In the GaN-based semiconductor stacked structure 51, striped projections 52 and striped recesses 53 are formed to correspond to stripes or resonators of laser devices 80. P-side electrodes 93 and n-side electrodes 92 are formed at the projections 52 and recesses 53. A light-emitting portion 54 is formed at each projection 52. The light-emitting portion 54 corresponds to the active region 85 to 87 under the current passage defined by the opening portion of the current block layer 90 shown in FIG. 8.

Scribe lines (top-surface pattern) 55 for separating the laser devices 80 are formed to extend from the top-surface side of the wafer through the GaN-based semiconductor stacked structure 51 to the sapphire substrate 81. The scribe lines 55 are formed to extend along the resonator end face, i.e., in a direction perpendicular to the direction of oscillation of a laser beam, and to skip the light-emitting portion 54.

In the first and second embodiments, the scribe lines (top-surface pattern) 55 can be formed before the wafers 103, 203 are bonded to the auxiliary plates 105, 205. By virtue of this process, when the devices are separated by extending the adhesive sheets 108, 208, the resonator end faces of laser devices 80 are formed as cleavage planes by the guiding of scribe lines (top-surface pattern) 55.

Alternatively, in the first and second embodiments, the scribe lines (top-surface pattern) 55 can be formed in a state where the wafers 103, 203 are removed from the auxiliary plates 105, 205 and attached to the adhesive sheets 108, 208. In this case, the wafer can be separated in units of a laser device 80 by the stress produced at the time of forming the scribe lines 55. In addition, in this case, since the scribe lines (top-surface pattern) 55 can be formed by viewing the bottom-surface scribe lines through the transparent substrate, the top-surface scribe lines and bottom-surface scribe lines can be easily aligned.

Note that, where the semiconductor devices are LEDs, top-surface scribe lines may be utilized to separate the devices. However, in this case, it is not necessary to form skips in the top-surface scribe lines.

As has been described above, according to the present invention, scribe lines for separating semiconductor devices can be formed without releasing a stress of the polished wafer, and the wafer can be exactly separated with a predetermined size, even in the case of the wafer wherein semiconductor devices are formed on a substrate with low cleavage.

In addition, according to this invention, a solution of pH7 or more is used in polishing semiconductor devices and thus the bottom surface of the substrate of sapphire, SiC, etc. can be flattened and end faces of the devices are formed independently from crystal orientation. Therefore, the performance of devices is enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of separating a plurality of semiconductor devices formed in a top surface of a wafer having said top surface and a bottom surface, said method comprising the steps of:

fixing said wafer on a polishing jig with an auxiliary plate interposed, such that said top surface faces said auxiliary plate and said bottom surface is exposed;

polishing said bottom surface of said wafer in a state where said wafer is fixed on said polishing jig, thus thinning said wafer;

scribing a separation pattern for separating said devices in said bottom surface of said wafer in a state where said wafer, after polished, is fixed on said auxiliary plate;

attaching an adhesive sheet to said bottom surface of said wafer, in which said separation pattern has been scribed;

removing said wafer as well as said adhesive sheet from said auxiliary plate; and dividing said wafer, removed from said auxiliary plate, into said devices according to said separation pattern in a state where said wafer is attached to said adhesive sheet.

2. The method according to claim 1, wherein said wafer and said auxiliary plate are bonded by a first adhesive, and said polishing jig and said auxiliary plate are bonded by a second adhesive.

3. The method according to claim 2, comprising a step of removing said wafer as well as said auxiliary plate from said polishing jig, between said step of polishing said wafer and said step of scribing said separation pattern.

4. The method according to claim 3, wherein said first and second adhesives consist essentially of first and second waxes respectively, said first wax has a higher melting point than said second wax, and said first and second waxes are heated in said step of removing said wafer as well as said auxiliary plate from said polishing jig.

5. The method according to claim 3, wherein said second adhesive consists essentially of a wax, and said second wax is heated by heat conduction from said polishing jig in said step of removing said wafer as well as said auxiliary plate from said polishing jig.

6. The method according to claim 3, wherein said second adhesive consists essentially of a wax, and said second wax is dissolved by a chemical in said step of removing said wafer as well as said auxiliary plate from said polishing jig.

7. The method according to claim 2, wherein said step of attaching said adhesive sheet to said bottom surface of said wafer is performed in a state where said wafer is fixed on said polishing jig with said auxiliary plate interposed.

8. The method according to claim 7, wherein said first and second adhesives consist essentially of first and second waxes respectively, said first wax has a lower melting point than said second wax, and said first and second waxes are heated in said step of removing said wafer from said auxiliary plate.

9. The method according to claim 1, wherein said semiconductor devices are laser devices, and said method comprises a step of scribing top-surface scribe lines for separating said laser devices on said top surface of said wafer, such that said top-surface scribe lines are formed to extend along oscillator end faces of said laser devices and to skip light-emitting portions of said laser devices.

10. The method according to claim 9, wherein said step of scribing said top-surface scribe lines is performed prior to said step of fixing said wafer on said polishing jig with said auxiliary plate interposed.

11. The method according to claim 9, wherein said step of scribing said top-surface scribe lines is performed after said step of removing wafer from said auxiliary plate.

12. The method according to claim 1, wherein said bottom surface of said wafer is defined by one of a sapphire substrate and an SiC substrate, and a polishing agent including a solution of pH7 or more is used in said step of polishing said bottom surface of said wafer.

13. The method according to claim 12, wherein said solution of pH7 or more contains at least one selected from said group consisting of isopropylmethyl-phenol, triethanolamine, propylene glycol, polyethylene glycol, dibuthylhydroxytoluene, oxybenzone, alkyl ether, sulfuric acid ester solidum, alpha-olefin sodium sulfonate, aliphatic acid alkanolamide, alkylamine oxide, and a surface-active agent.

14. The method according to claim 1, wherein said semiconductor devices are laser devices having stacked structures of Group III nitride semiconductor layers, and said method comprises a step of polishing oscillator end faces of each of said laser devices by using a polishing agent containing a solution of pH7 or more.

15. A method of separating a plurality of semiconductor devices formed in a top surface of a wafer having said top surface and a bottom surface, said bottom surface of said wafer being defined by a sapphire substrate, each of said semiconductor devices including a stacked structure of Group III nitride semiconductor layers, said method comprising the steps of:

fixing said wafer on a polishing jig with an auxiliary plate interposed, such that said top surface faces said auxiliary plate and said bottom surface is exposed;

polishing said bottom surface of said wafer in a state where said wafer is fixed on said polishing jig, thus thinning said wafer;

scribing a separation pattern for separating said devices in said bottom surface of said wafer in a state where said wafer, after polished, is fixed on said auxiliary plate;

attaching an adhesive sheet to said bottom surface of said wafer, in which said separation pattern has been scribed;

removing said wafer as well as said adhesive sheet from said auxiliary plate; and dividing said wafer, removed from said auxiliary plate, into said devices according to said separation pattern in a state where said wafer is attached to said adhesive sheet.

16. The method according to claim 15, comprising a step of removing said wafer as well as said auxiliary plate from said polishing jig, between said step of polishing said wafer and said step of scribing said separation pattern, wherein said wafer and said auxiliary plate are bonded by a first wax, said polishing jig and said auxiliary plate are bonded by a second wax, said first wax has a higher melting point than said second wax, and said first and second waxes are heated in said step of removing said wafer as well as said auxiliary plate from said polishing jig.

17. The method according to claim 15, wherein said step of attaching said adhesive sheet to said bottom surface of said wafer is performed in a state where said wafer is fixed on said polishing jig with said auxiliary plate interposed, and wherein said wafer and said auxiliary plate are bonded by a first wax, said polishing jig and said auxiliary plate are bonded by a second wax, said first wax has a lower melting point than said second wax, and said first and second waxes are heated in said step of removing said wafer from said auxiliary plate.

18. The method according to claim 15, wherein said semiconductor devices are laser devices, and said method comprises a step of scribing top-surface scribe lines for separating said laser devices on said top surface of said wafer, such that said top-surface scribe lines are formed to extend along oscillator end faces of said laser devices and to skip light-emitting portions of said laser devices.

19. The method according to claim 15, wherein a polishing agent including a solution of pH7 or more is used in said step of polishing said bottom surface of said wafer.

20. The method according to claim 15, wherein said semiconductor devices are laser devices, and said method comprises a step of polishing an oscillator end face of each of said laser devices by using a polishing agent containing a solution of pH7 or more.

\* \* \* \* \*